(12) United States Patent
Gardner et al.

(10) Patent No.: US 7,087,941 B2
(45) Date of Patent: Aug. 8, 2006

(54) LLL-PHOSPHIDE LIGHT EMITTING DEVICES WITH THIN ACTIVE LAYERS

(75) Inventors: Nathan F. Gardner, San Jose, CA (US); Fred A. Kish, San Jose, CA (US); Herman C. Chui, Sunnyvale, CA (US); Stephen A. Stockman, Morgan Hill, CA (US); Michael R. Krames, Mountain View, CA (US); Gloria E. Hofler, Sunnyvale, CA (US); Christopher Kocot, Palo Alto, CA (US); Nicolas J. Moll, La Honda, CA (US); Tun-Sein Tan, Los Altos Hills, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 431 days.

(21) Appl. No.: 10/011,521

(22) Filed: Nov. 5, 2001

(65) Prior Publication Data

US 2002/0127751 A1 Sep. 12, 2002

Related U.S. Application Data

(63) Continuation of application No. 09/122,568, filed on Jul. 24, 1998.

(51) Int. Cl.
*H01L 31/72* (2006.01)
(52) U.S. Cl. ...................... 257/200; 257/201
(58) Field of Classification Search ............. 257/94, 257/183, 200, 201
See application file for complete search history.

(56) References Cited

U.S. PATENT DOCUMENTS

| 5,008,718 A | 4/1991 | Fletcher et al. |
| 5,060,028 A | 10/1991 | Kuo et al. .................. 25/94 |
| 5,153,889 A | 10/1992 | Sugaware et al. |

(Continued)

FOREIGN PATENT DOCUMENTS

GB 2 301 934 A 12/1996

OTHER PUBLICATIONS

Current Voltage Characteristics of pp-Isotype InGaAlP/ GaAs Heterojunction with a Large Valence-Band discontinuity; By Kazuhiko Itaya, Masayuki Ishikawa, Gen-ichi Hatakoshi, Jpn. J. Appl. Phys. vol. 32 (1993) Pt. 1, No. 5A (pp. 1919-1922).

*Primary Examiner*—Long Pham
(74) *Attorney, Agent, or Firm*—Patent Law Group LLP

(57) ABSTRACT

The extraction efficiency of a light emitting device can be improved by making the absorbing device layers as thin as possible. The internal quantum efficiency decreases as the device layers become thinner. An optimal active layer thickness balances both effects. An AlGaInP LED includes a substrate and device layers including an AlGaInP lower confining layer of a first conductivity type, an AlGaInP active region of a second conductivity type, and an AlGaInP upper confining layer of a second conductivity type. The absorbance of the active region is at least one fifth of the total absorbance in the light-emitting device. The device optionally includes at least one set-back layers of AlGaInP interposing one of confining layer and active region. The p-type upper confining layer may be doped with oxygen improve the reliability.

13 Claims, 14 Drawing Sheets

U.S. PATENT DOCUMENTS

| | | |
|---|---|---|
| 5,233,204 A | 8/1993 | Fletcher et al. |
| 5,376,580 A | 12/1994 | Kish et al. |
| 5,410,159 A | 4/1995 | Sugawara et al. |
| 5,661,742 A * | 8/1997 | Huang et al. ............... 372/46 |
| 5,710,440 A | 1/1998 | Okagawa et al. |
| 5,732,098 A | 3/1998 | Nisitani et al. |
| 5,744,829 A | 4/1998 | Murasato et al. ............. 257/94 |
| 5,793,062 A * | 8/1998 | Kish, Jr. et al. ............. 257/98 |
| 5,811,839 A * | 9/1998 | Shimoyama et al. ......... 257/94 |
| 5,917,201 A * | 6/1999 | Ming-Jiunn et al. .......... 257/94 |
| 6,081,540 A * | 6/2000 | Nakatsu ...................... 372/45 |

* cited by examiner

LLL-PHOSPHIDE LIGHT EMITTING DEVICES WITH THIN ACTIVE LAYERS

CROSS REFERENCE TO RELATED APPLICATIONS

This application is a continuation of application Ser. No. 09/122,568, filed Jul. 24, 1998, incorporated herein by reference in its entirety.

FIELD OF THE INVENTION

The present invention relates to a semiconductor light emitting device formed on a substrate using a compound semiconductor layer of AlGaInP to form an active layer, a p-n junction to inject carriers into this active layer, and the thickness of the active layer and other constituent layers are chosen to optimize the efficiency of light emission.

BACKGROUND OF THE INVENTION

Light emitting diodes (LEDs) are widely accepted in many applications that require low power consumption, small size, and high reliability. Energy-efficient diodes that emit light in the yellow-green to red regions of the visible spectrum contain active layers formed of an AlGaInP alloy. The conventional AlGaInP LED, shown in FIG. 1, includes a semiconductor substrate, e.g. GaAs, a lower confining layer, an active layer, an upper confining layer, all placed in a "double heterostructure" configuration, followed by an optional window layer. The confining layers are made of a transparent semiconductor and enhance the "internal quantum efficiency" of the LED, defined as the fraction of electron-hole pairs in the active layer that recombine and emit light. The window layer, also a transparent semiconductor, increases the spread of electric current across the active layer and enhances the internal quantum efficiency of the diode.

The internal quantum efficiency of an AlGaInP LED depends upon, among other things, the thickness of the active layer and its alloy composition (which determines the color of the emitted light), and the alloy composition of the confining layers. Curve (a) of FIG. 2 shows the internal quantum efficiency of an absorbing substrate AlGaInP LED as the thickness of the active layer is varied. The efficiency of the LED depends on the degree to which the electrons or holes (whichever is the minority carrier) recombine radiatively in the active layer. The alloy compositions and doping concentrations of the confining layers are chosen to create a potential energy barrier between the active and confining layers. A relatively small fraction of the injected minority carriers have sufficient kinetic energy to overcome the barrier and diffuse out of the active layer. Thus, if the active layer thickness is less than the diffusion length of the minority carriers, then the minority carrier concentration is increased by the presence of the confining layers (if a constant current is applied to the device). This results in an increase in internal quantum efficiency, since the rate at which carriers recombine radiatively increases with the carrier density. If the active layer thickness is greater than the diffusion length, then the internal quantum efficiency decreases because the confining layers do not increase the carrier density.

Although the confining layer compositions are selected to maximize the confinement energy, in the AlGaInP material system, this energy is not large enough to completely prevent carriers from "leaking" out of the active layer. In the wide-energy-gap alloys utilized for the confining layers ($(Al_xGa_{1-x})_{0.5}In_{0.5}P$ with $x>0.55$), non-radiative recombination occurs at a high rate, so carriers which leak out of the active layer are essentially lost and the internal quantum efficiency of the LED suffers. The magnitude of the leakage current is determined by alloy compositions of the active layer and adjacent layers and the resultant differences in their energy gaps. Thus, if a wider-gap active layer is used to generate 590-nm light, the carrier confinement is poorer than if the active layer generates 630-nm light, when the LED is otherwise identical. Those skilled in the art will recognize that LEDs do not emit light of only one wavelength. The LED wavelength is defined at the point of maximum photon emission The rate at which carriers escape from the active layer is furthermore related to the concentration of carriers located at the interface between the active and confining layers. This concentration decreases as the active layer thickness increases. Taking these two effects together (leakage and carrier concentration), the active layer thickness for highest internal quantum efficiency will vary with the color of the emitted light. This is illustrated by curve (b) of FIG. 2, which shows, as a function of active layer thickness, the efficiency of a second AlGaInP LED that emits at a shorter wavelength. Because the confinement energy is smaller, an optimal active layer is thicker.

In U.S. Pat. No. 5,153,889; Sugawara et at. show that if the active layer of an absorbing substrate AlGaInLP LED is thicker than the diffusion length of the injected minority carriers, then the double heterostructure does not provide additional confinement of electrons and holes in the active layer. On the other hand, if the active layer is too thin (<1500 Å, according to the authors), then the density of carriers within the active layer is so high that a substantial fraction of them escape into the confining layers. For a p-type active layer with a net hole concentration of about $5 \times 10^{16}$ cm$^{-3}$ and an upper confining layer composition $(Al_{0.5}Ga_{0.5})_{0.5}In_{0.5}P$ with a net hole concentration of about $5 \times 10^{17}$ cm$^{-3}$, the optimal active layer thickness is specified to be between 1500 Å and 7500 Å. In U.S. Pat. No. 5,710,440, Kagawa et at. demonstrate that with an $(Al_{0.5}Ga_{0.3})_{0.5}In_{0.5}P$ upper confining layer with a net hole concentration of about $3 \times 10^{17}$ cm$^{-3}$, the optimum active layer thickness ranges between 1.1 μm and 1.3 μm for an absorbing substrate (AS) LED.

Another way in which the internal quantum efficiency can be improved, particularly for short-wavelength-emitting LEDs, is with multi-quantum-well (MQW) structures. In these devices, the light emission occurs in multiple (usually five or more) thin quantum well active layers of light-emitting AlGaInP (also known as "wells") between multiple "barrier" layers of another alloy composition of AlGaJnP that is transparent to visible light. An active region consists of one or more light-emitting layers. For a MQW structure, optically transparent higher bandgap barrier layers separate the active layers. The total active region thickness is the sum of the thicknesses of all active layers (wells) and barriers. The total active layer thickness is the sum of the thicknesses of all the individual light emitting active layers (wells). For a single light emitting layer device, the active layer and active region thickness are the same. To form a quantum well (wherein the carriers exhibit quantum size effects), the thickness of the wells must be less than 200 Å, which is roughly the length of the wave function of a thermal electron in AlGaInP, in the effective mass approximation. The exact thickness depends on the alloy composition of the quantum wells and barriers. If the carriers which leak out of the thin quantum well can recombine in a second or third, or fourth, etc. well, the internal quantum efficiency of the LED is improved. It is for this reason that quantum-well LEDs typically have several tens of wells in the active region. Furthermore, the total thickness of the wells is described as the active layer thickness because light is not emitted from the barriers. Sugawara et al. describe in U.S. Pat. No. 5,410,159 a method for determining the optimum combination of well thicknesses and number of wells to produce a high efficiency absorbing substrate LED. Utilizing forty 50 Å-thick wells (for a total active layer thickness of 2000 Å) with alloy composition $(Al_{0.3}Ga_{0.7})_{0.5}In_{0.5}P$, the authors achieved ~2.7% external quantum efficiency at 20 mA of drive current, and an emission wavelength of 575 nm. Huang et al. also describe the use of MQW active regions in U.S. Pat. No. 5,661,742, although the authors do not specify the external quantum efficiencies that they achieved.

Internal quantum efficiency is one factor determining the "external quantum efficiency" of a LED, defined as the ratio of the number of photons exiting the LED to the number of electrons which enter it through the contacts. Another factor is the "extraction efficiency", defined as the fraction of photons generated in the active layer that escape from the semiconductor surfaces of the LED and enter the surrounding material. The optional window layer enhances extraction efficiency by allowing more light to exit the semiconductor material. The extraction efficiency of an LED can be much improved by either growing or mechanically bonding the lower confining layer upon a transparent substrate (TS) rather than an absorbing one. The extraction efficiency of TS AlGaInP LEDs can be approximately twice as high as that of AS AlGaInP LEDs, improving the external quantum efficiency of the LED by approximately a factor of two.

The extraction efficiency of a transparent substrate LED (TS-LED) is reduced by the presence of any layers in the LED that have an energy gap equal to or smaller than that of the light-emitting layers. This is because some of the light that is emitted by the active layer passes through the absorbing layers before it exits the LED. Typical, but not all, absorbing layers are formed of alloys of $(Al_xGa_{1-x})_{0.5}In_{0.5}P$ where x<0.55, or of $Al_yGa_{1-y}As$ and related alloys. These layers may be located between the active layer and the window layer, and between the lower confining layer and the substrate. These absorbing layers are included because they reduce the number of dislocations or other defects in the active layer or are used to simplify the LED manufacturing process. Another effect is to reduce band offsets at heterointerfaces, which lower the voltage that must be applied to the contacts in order to force a particular current through the diode. Because the absorbing layers tend to absorb shorter-wavelength light more effectively than longer-wavelength light, LEDs that emit at 590 nm suffer a greater performance penalty due to the presence of these layers than LEDs that emit at 640 nm.

Absorption in the active region also reduces the extraction efficiency. FIG. 3 is a diagram of light passing through a transparent substrate AlGaInP LED. The arrow represents the light emitted by the active layer when an electric current is injected at the p-n junction via the contacts of the LED. This ray of light is emitted towards the bottom of the device, reflects off of the back contact, and passes again through the substrate, lower confining layer, and active layer. The active layer reabsorbs part of this ray of light as it passes through, as indicated by the thinning of the line representing the ray of light. The absorption coefficient of the active layer is typically not as large as that of the narrow gap layers in the LED. However, because light rays may reflect off the internal surfaces of the LED several times (and pass through the active layer several times) before escaping, a substantial fraction of the emitted light may be absorbed in the active layer. In contrast, light emitted by the active layer of an absorbing substrate LED only passes through the active layer once, because light that reflects off of an internal surface will generally be completely absorbed by the substrate. Therefore, absorption in the active layer has little effect on the external quantum efficiency of an AS LED.

When light is absorbed by the active layer (either a single layer or a plurality of layers arranged in a multiple-well configuration), electron and hole pairs are formed that may recombine radiatively or non-radiatively. In AlGaInP active layers, only a fraction of the absorbed photons is re-emitted. This fraction is equivalent to the internal quantum efficiency of the active layer, and is determined by the alloy composition of the active layer (i.e. the emission wavelength of the LED) and the predilection of electron-hole pairs to recombine non-radiatively through crystalline defects or impurities. Typically, for a 590 nm LED, only 5–50% of the absorbed photons will be re-emitted by the active layer. Thus, 95–50% of the light that is originally emitted by and subsequently absorbed by the active layer is lost irretrievably, resulting in a decrease in extraction efficiency and the external quantum efficiency of the device.

In the prior art, techniques for improving the efficiency of AlGaInP LEDs have focussed on determining the active layer thickness which results in greatest internal quantum efficiency and on increasing the extraction efficiency of the LED by removing the absorbing substrate.

SUMMARY OF THE INVENTION

The extraction efficiency of a TS-LED can be further improved by making all absorbing layers, including the active layer, as thin as possible. However, in AlGaInP LEDs, ultra-thin active layers result in a decrease in the internal quantum efficiency of the LED. An optimal active layer thickness will balance the effects of increasing extraction efficiency and decreasing internal quantum efficiency. Consequently, the TS-LED has neither optimal extraction efficiency nor optimal internal quantum efficiency when its external quantum efficiency is maximized.

The present invention is an LED that includes an AlGaInP active region that has active layer thickness which provides superior external quantum efficiency in a transparent substrate LED while accounting for compromises between $\eta_{internal}$ (internal quantum efficiency) and $\eta_{extraction}$ (extraction efficiency). Because $\eta_{internal}$ is a function of many properties, particularly the composition of the active region and the confining layers, the optimum thickness is specific to a particular AlGaInP LED design. The thickness and number of layers in the active region are specified to provide superior external quantum efficiency. Furthermore, the external quantum efficiency of the LED does not change substantially with prolonged operation. Specific ranges for the thickness of the active layer, the thickness of confining layers, and other conditions of the constituting elements can increase the external quantum efficiency and manufacturability.

The LED includes device layers formed on a substrate of a first conductivity type. The device layers have a total absorbance. These layers include a lower confining layer of an AlGaInP alloy of the first conductivity type, an active region of AlGaInP of a second conductivity type, and an upper confining layer of an AlGaInP alloy of the second conductivity type. The absorbance of the active region is at least one fifth of the total absorbance and the absorbance of the active region is less than 0.2. To improve reliability and manufacturability, the LED may optionally include one or two set-back layers of AlGaInP, the set-back layer interposing one of confining layer and active region. The set-back layers provide a region wherein dopant atoms may migrate during high temperature processing, while maintaining the p-n junction in the same location in the finished LED. Furthermore, the set-back layers can reduce the sensitivity of the internal quantum efficiency to changes in the temperature of the LED. The p-type upper confining layer may be doped with oxygen to improve the reliability of the LED.

DESCRIPTION OF THE PREFERRED EMBODIMENTS

Figure 1:
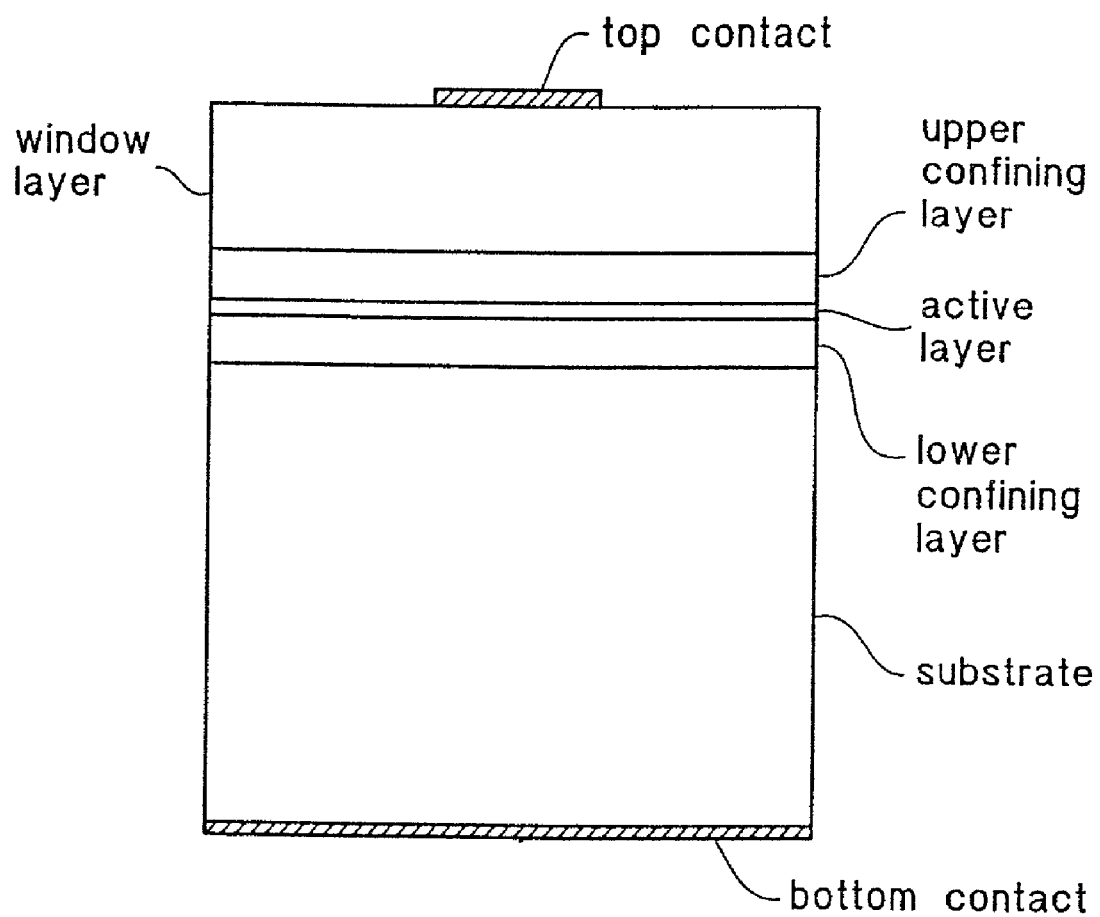
FIG. 1 illustrates a prior art transparent substrate light-emitting device.
Figure 2:
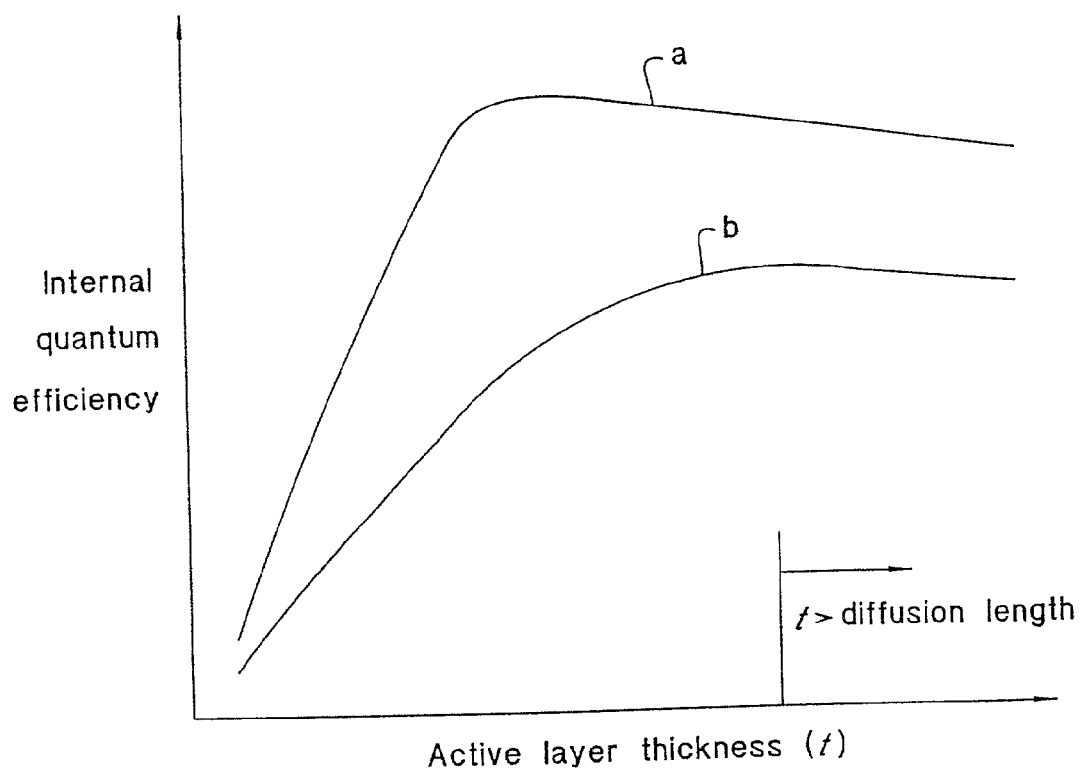
FIG. 2 illustrates the internal quantum efficiency of two AS-LEDs.
Figure 3:
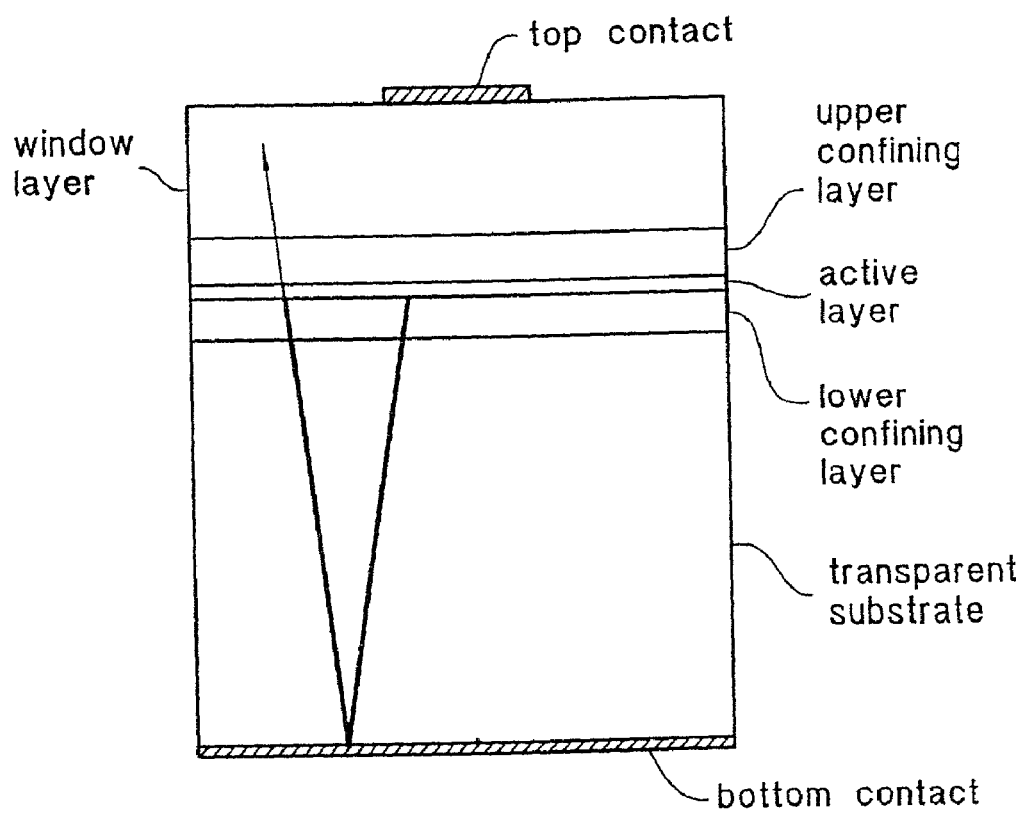
FIG. 3 illustrates light passing through the device shown in FIG. 1.
Figure 4:
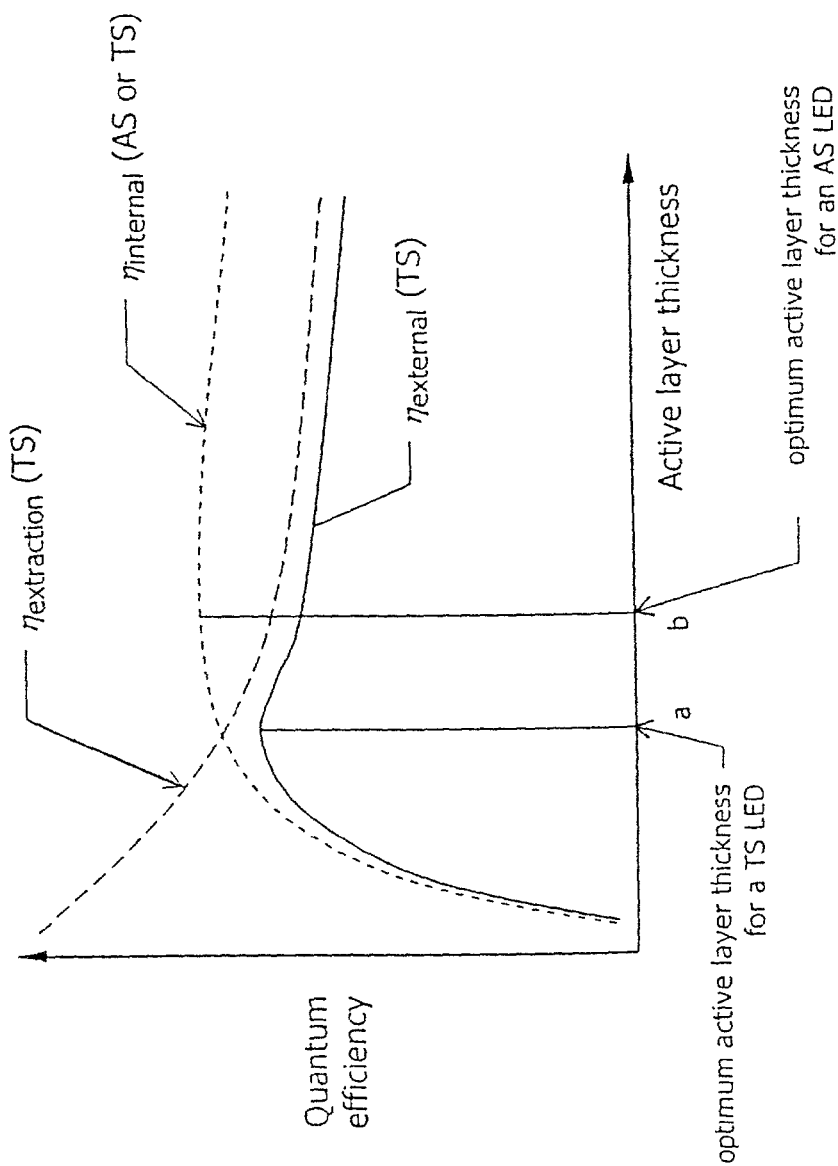
FIG. 4 shows the dependence of quantum efficiency on the active layer thickness for a TS LED.

FIG. 4 shows the dependence of internal quantum efficiency, extraction efficiency, and external quantum efficiency on the thickness of the active layer for an AlGaInP transparent substrate light emitting diode (TS-LED). The external quantum efficiency is the product of the internal quantum efficiency and the extraction efficiency:

$$\eta_{external} = \eta_{internal} \times \eta_{extraction}$$

For one range of active layer thicknesses shown in FIG. 4, the external quantum efficiency is limited by the internal quantum efficiency, and in another range of thicker active layers, the external quantum efficiency is limited by the extraction efficiency. A TS-LED with optimal external quantum efficiency has an active layer thickness that is chosen to balance the influence of internal quantum efficiency and extraction efficiency, as shown by Point A. In contrast, an AS-LED with optimal external quantum efficiency also has optimal internal quantum efficiency and the active layer thickness is chosen to maximize this efficiency, shown by Point B. Because the internal quantum efficiency of the LED depends on many layer specific properties, e.g. the composition and doping of the device layers, the active layer thickness for maximum external quantum efficiency will vary. Some of the specific dependencies will be described in detail below.

The extraction efficiency depends on active layer thickness only if the absorption in this region is a significant fraction of the total absorption in the LED. In one extreme, the active layer is the only absorbing layer in the LED, e.g. a transparent-substrate LED, and varying its thickness has a large effect on extraction efficiency. In the other extreme, e.g. an absorbing-substrate LED with a thin (<2000 Å) active layer, the active layer contributes little to the total absorption in the device and reducing its thickness does not significantly improve the extraction efficiency.

The degree to which a particular layer absorbs light can be quantified by defining, with the following expression, an absorbance for the layer:

$$\text{absorbance} = 1 - \exp[-\alpha(\lambda_{peak}) \cdot L] \qquad \text{Eq. (1)}$$

where $\alpha$ is the absorption coefficient of the layer at the peak wavelength of the LED's emission spectrum, and L is the thickness of the same layer. When defining absorbance, light is assumed to pass through the layer at normal incidence. Light which passes through the layer at an oblique angle will travel through an apparent layer thickness that is larger than L, so Eq. 1 represents the minimum absorbance that the active layer will have. It would be obvious to one skilled in the art that if a semiconductor layer that partially covers the layer below it, then the absorbance should be calculated with respect to the ratio of the area of the semiconductor layer to the area of the LED.

Figure 5:
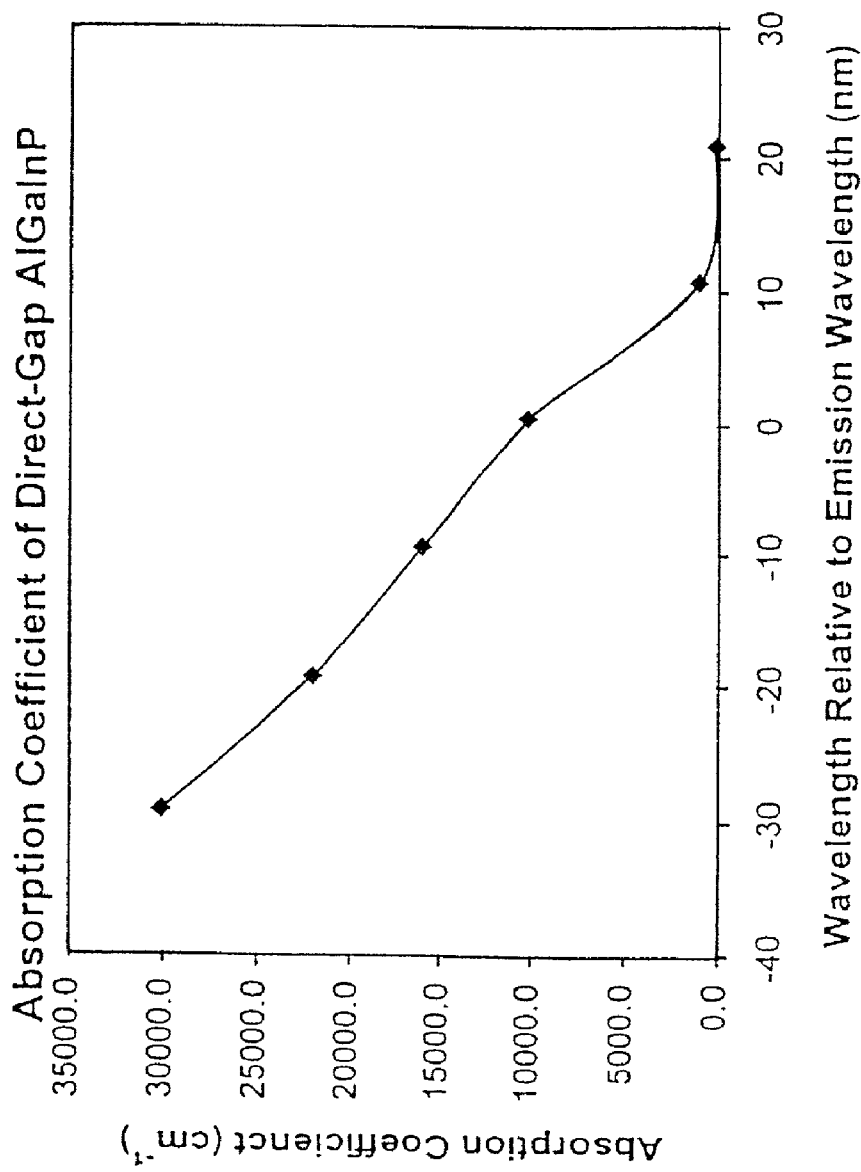
FIG. 5 shows the absorption coefficient of an alloy of AlGaInP as a function of photon energy.

According to Equation 1, a layer having a high absorption coefficient or large thickness will absorb more light than a layer having a low absorption coefficient or that is thin. FIG. 5 illustrates the absorption coefficient, expressed in $cm^{-1}$, as a function of photon energy for direct-gap, light-emitting AlGaInP. The energy is expressed as the difference between the energy of the incident photon and the energy of the photons that the AlGaInP layer emits. There are typically several absorbing layers in an LED, and the total absorbance in the device layer (all of the layer in the LED excluding the substrate) is determined by the following sum:

$$\text{total absorbance} = 1 - \exp\left[-\sum_i \alpha^i_{AL}(\lambda_{peak}) \cdot L^i_{AL}\right], \qquad \text{Eq. (2)}$$

where there are i semiconductor layers in the device which absorb the light emitted by the active layer, including the active layer itself (or active layers, if there is more than one) and excluding the substrate (again assuming normal incidence of light on the layers). To maximize the benefit of reducing the active layer thickness, the preferred relative absorption of the active layers and "parasitic" absorbing layers can be expressed mathematically by comparing the absorbance in the active region to the total absorbance of the device layers. The absorbance of the active region is determined by the following sum:

$$\text{active region absorbance} = 1 - \exp\left[-\sum_i \alpha_{AL}^j(\lambda_{peak}) \cdot L_{AL}^j\right], \quad \text{Eq. (3)}$$

where the subscript AL refers to the light-emitting active layers in the LED's active region. The "active layer thickness" is the summation of the thicknesses of the j light-emitting active layers. For an optimal device, the active region absorbance is related to the total absorbance by:

$$(\text{active region absorbance}) \geq \frac{1}{5}(\text{total absorbance}), \quad \text{Eq. (4)}$$

Equation 4 requires that the absorbance of the active region is at least one fifth of the total absorbance in the semiconductor device layers.

The thicknesses of the parasitic absorbing layers in an LED are typically on the order of 100–1000 Å as described by Itaya et al. in "Current-voltage characteristics of p-p isotype InGaAlP/GaAs heterojunction with a large valence-band discontinuity," *Japanese Journal of Applied Physics*, vol. 32, pp. 1919–1922, 1993. The thickness is constrained on the lower end because of the necessity to grow a layer thick enough to be reproducible in high-volume manufacturing by OMVPE (metal-organic chemical vapor deposition) or MBE (molecular beam epitaxy) and have the desired effect, and is constrained on the upper end by a need to minimize parasitic losses, particularly if the layer is located between the active region and the window layer of the LED. If the parasitic layers are formed of $In_{0.5}Ga_{0.5}P$, which has the worst-case absorption coefficient for an $(Al_xGa_{1-x})_{0.5}In_{0.5}P$ alloy, the thicknesses above correspond to a range of absorbances of 0.04 to 0.34 (for an emission wavelength of 555 nm, which is the shortest emission wavelength from direct-gap AlGaInP). Equation 4 requires that the minimum active region absorbance be in the range of 0.01 to 0.085.

When Eq. 4 is satisfied, changing the thickness of the active layer will have a meaningful effect on the extraction efficiency of the LED. If, for example, the absorbance of the active layer in the LED is slightly less than one-fifth of the total absorbance, then reducing the active layer thickness by a factor of 2 decreases the total absorbance of the device by ~10%. The extraction efficiency will increase by a smaller amount, because of reflective losses inside the device. However, this magnitude of an improvement in device performance can not be repeatably distinguished from noise in the experimental measurements of external quantum efficiency. Hence, the active layer absorbance should have a larger impact on external quantum efficiency, and Eq. 4 satisfies this requirement.

The maximum active region absorbance of an optimal LED depends upon the internal quantum efficiency of the active region. For a 590-nm-emitting LED, the internal quantum efficiency may be as low as 5%. If the absorbance of the active region is 0.45 (corresponding to an active layer thickness of 7500 Å, which is commonly utilized in the prior art), then after each pass of a ray of light through the active layer the ray of light is 0.57× of its original intensity. An optimal active region will result in the single-pass intensity of a ray of light being minimally affected, defined to be at least 0.8× of its original intensity. This condition for single-pass intensity is satisfied by, and results in improved external quantum efficiency of, all of the transparent-substrate AlGaInP LEDs studied. For an AlGaInP LED with an internal quantum efficiency of 5%, this corresponds to an active layer thickness of 3800 Å and an absorbance of 0.26. Some AlGaInP LEDs, particularly those that emit in the green, have internal quantum efficiencies which are lower than 5%. In order to accommodate an active layer with an internal quantum efficiency that is <<5% (nearly zero), an upper limit for the active region absorbance can be established at 0.2, corresponding to an active layer thickness of 2800 Å. For an LED with higher internal quantum efficiency, the active region absorbance may be greater than 0.2 while maintaining the 0.8× single-pass transmittance. However, a thinner active layer will have superior extraction efficiency and is preferred. Thus, in order to optimize extraction efficiency, there is no lower limit on the absorbance of the active region, except for the requirement of Eq. 4.

Figure 6:
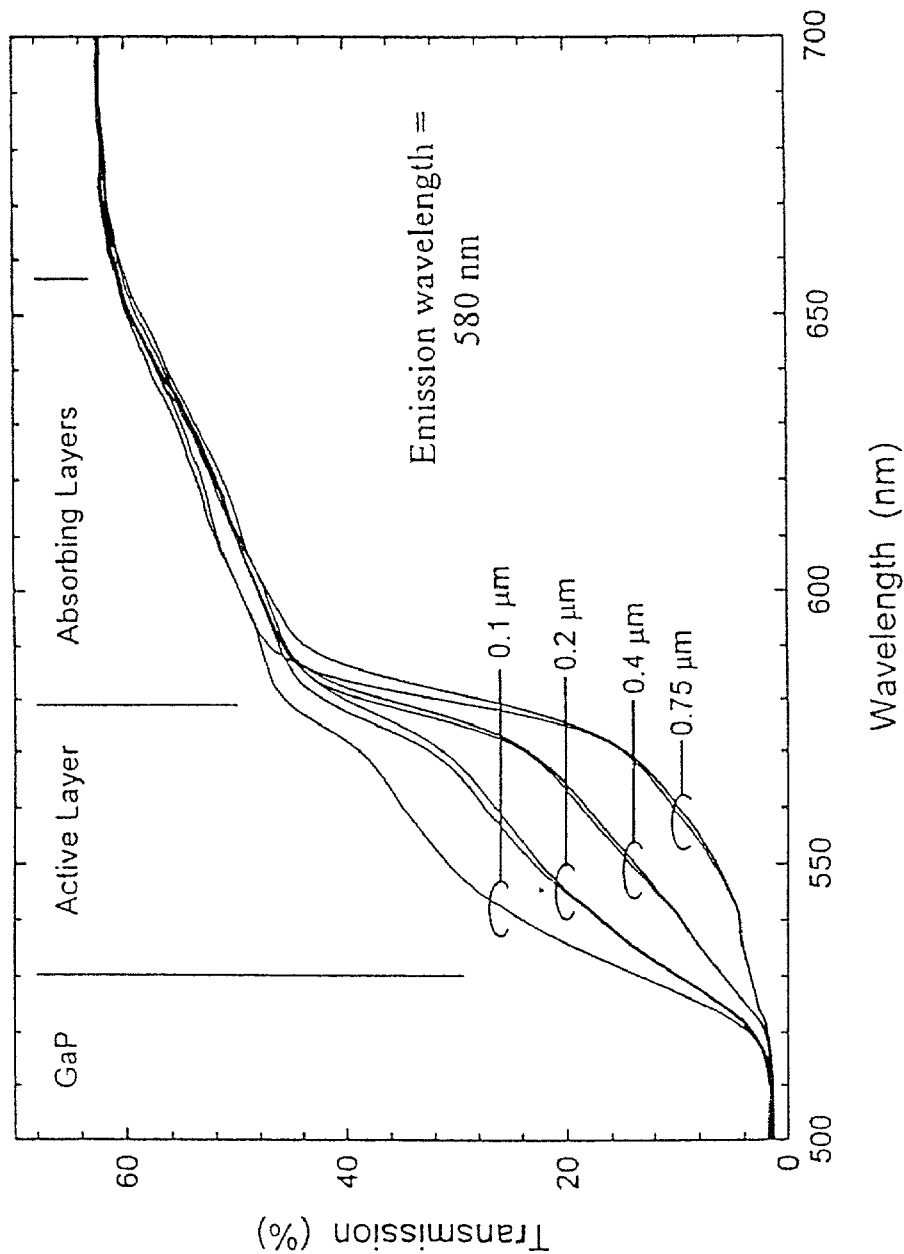
FIG. 6 shows the percentage of light transmitted through several different TS LED wafers.

FIG. 6 shows the percentage transmission of light through several TS AlGaInP LED wafers, each with a different thickness of active layer. This figure shows the effect of active layer thickness on the ability of light to pass through the active layer with minimal absorption. The absorption due to additional layers that are present in these LEDs is also shown. In one embodiment of a 590 nm-emitting AlGaInP TS LED, the absorbance of the active layer is 0.15, and the absorbance of the parasitic layers is 0.15. This LED has an external quantum efficiency that is 28% greater than that of an LED of the prior art which has an active layer absorbance of 0.45 and is otherwise identical.

Figure 7:
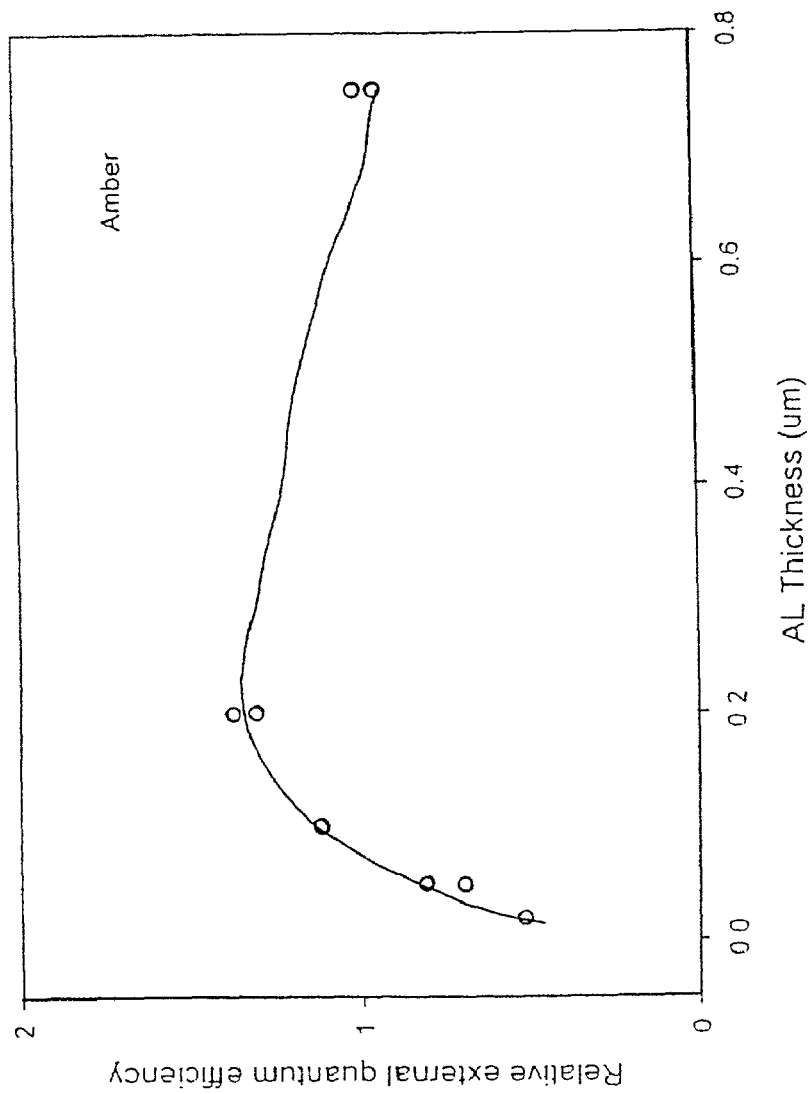
FIG. 7 shows the relative external quantum efficiency of a 590 nm TS-LED with different thickness active layers.

Another parameter that determines the optimal active layer thickness is the alloy composition of the active layer (which determines the color of light that the LED emits). FIG. 7 shows, for an LED comprising a transparent substrate, a lower confining layer of $Al_{0.5}In_{0.5}P$ formed on the substrate, and active layer of $(Al_{0.3}Ga_{0.7})_{0.5}In_{0.5}P$ (emitting at 590 nm) of varying thickness formed on the lower confining layer, an upper confining layer of $Al_{0.5}In_{0.5}P$ formed on the active layer, and a window layer, the relative external quantum efficiency as the active layer thickness varies. The external quantum efficiency increases as the active layer thickness is increased from 100 Å to 2000 Å. The efficiency decreases as the active layer thickness is increased to 7500 Å. The decrease in external efficiency from 2000 Å to 7500 Å is a result of the lower extraction efficiency and lower carrier densities in the thicker active layers, which reduces the radiative recombination rate. As the active layer thickness is decreased below 1000 Å, the leakage rate of the minority carriers out of the active layer becomes high, so the device efficiency decreases over this range.

Because the properties of the constituent layers in the LED cannot be controlled perfectly, the optimum thickness of the active layer will vary over the range of 1000–2500 Å, corresponding to an absorbance of 0.08–0.18. LEDs that emit at less than 600 nm also demonstrate improved performance over this range of active layer absorbances.

Figure 8:
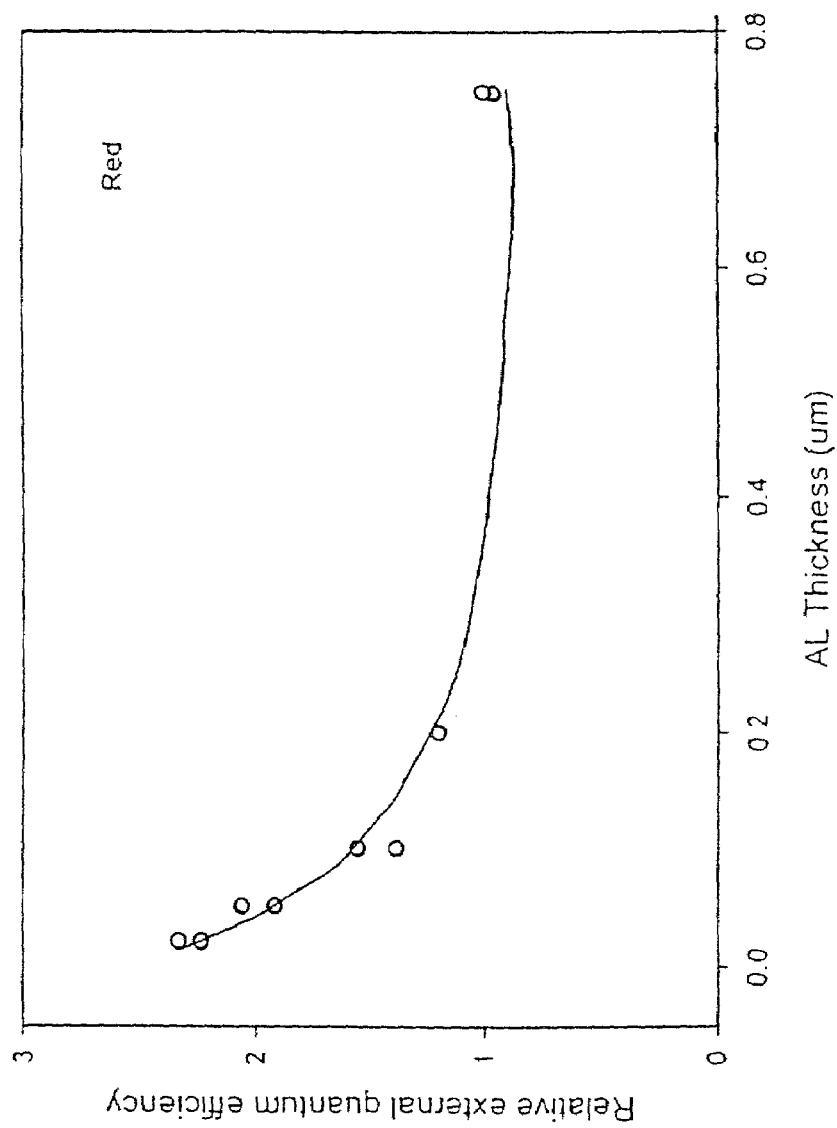
FIG. 8 shows the relative external quantum efficiency of a 630 nm TS-LED with different thickness active layers.

In comparison, FIG. 8 shows, for an LED comprising a transparent substrate, a lower confining layer of $Al_{0.5}In_{0.5}P$ formed on the substrate, and active layer of $(Al_{0.1}Ga_{0.9})_{0.5}In_{0.5}P$ (emitting at 630 nm) of varying thickness formed on the lower confining layer, an upper confining layer of $Al_{0.5}In_{0.5}P$ formed on the active layer, and a window layer, the relative external quantum efficiency as the active layer thickness varies. The external quantum efficiency decreases as the active layer thickness is increased from 100 Å to 7500 Å. The maximum external quantum efficiency is achieved for active layer thicknesses less than 500 Å (corresponding to an absorbance of 0.04). According to the effects described above, the internal quantum efficiency will decrease as the active layer thickness is reduced beyond some point below 100 Å. Because the energy gap of the active layer in the red LED is smaller than that in the amber LED and the alloy compositions of the confining layers are the same for both LEDs, the carrier confinement in the red LED is superior. Consequently, in the red device, the effects of carrier leakage from the active layer are significant only with much thinner active layers and the optimal active layer is much thinner. LEDs that emit greater than 620 nm demonstrate improved performance over the range of active layer thicknesses of 200 Å to 1500 Å. Similarly, data exist which demonstrate that LEDs which emit in the wavelength range of 600–620 nm have optimal external quantum efficiencies when the active layer thickness lies in the range of 500–2500 Å.

One problem with thinner active layers is that the internal quantum efficiency becomes more sensitive to variations in the doping levels in the confining layers, which reduces the manufacturing yield and hence increases the cost of the LEDs. In one embodiment of an AlGaInP LED, the upper confining layer is doped, during growth, with a p-type dopant, e.g. Zn or Mg. As the wafer undergoes subsequent high-temperature processing steps, the p-type dopant diffuses out of the upper confining layer. The internal quantum efficiency is greatest when the p-n junction is located precisely at the interface between the active layer and the n-type lower confining layer, because the heterojunction increases the number of electrons which the p-n junction will inject into the p-type active layer. The redistribution of dopants during growth and subsequent processing may cause the p-n junction to not be optimally located.

When the active layer is thin and the adjacent confining layers are doped, it is more likely that the p-n junction will be misplaced because of small variations in the initial dopant concentrations in the confining layers. For example, a 7× change in the external quantum efficiency of LEDs with 1000 Å thick active layers has been observed, in response to a 20% change in the concentration of dopant atoms in the upper confining layer. This sensitivity is reduced by the use of set-back layers. These are unintentionally doped layers interposing the active and confining layers, into which dopant atoms from the confining layers diffuse during growth or processing. The thickness of these layers is chosen to cause the p-n junction to be located, for the case of a device with only an upper set-back layer, at the lower-confining-layer/active-layer heterointerface at the end of the entire device fabrication process. For the case of a device with a lower set-back layer, the optimal position of the p-n junction is between the lower-set-back-layer/active-layer heterointerface and the lower confining layer/lower set-back layer heterointerface. The diffusion coefficients of the dopant through the different layers in the device, as well as the temperature and duration of the processing steps, will determine the necessary thicknesses of the set-back layers. Furthermore, the set-back layers may be formed of a plurality of layers of different semiconductor alloys or compounds that are transparent to the light emitted by the active layer. The set-back layers may also comprise layers wherein the composition of the alloy varies spatially, e.g. linearly graded or parabolically graded.

Figure 9A:
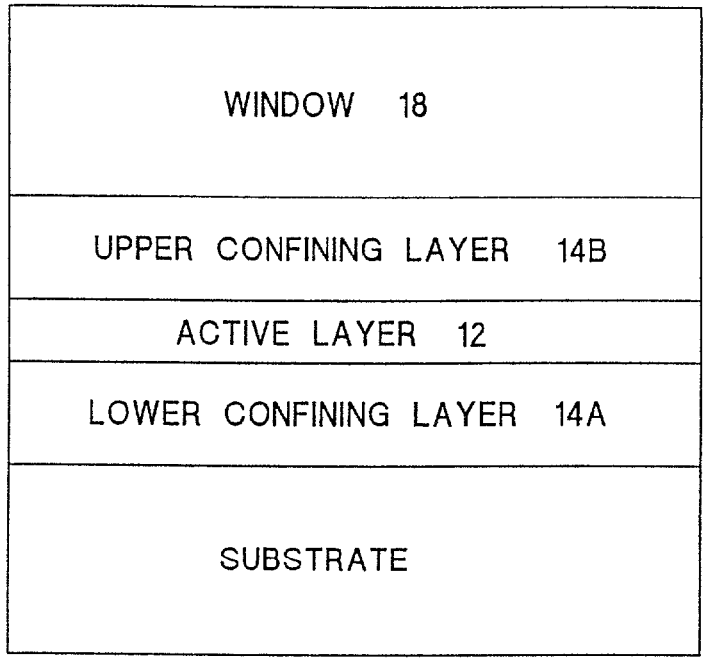
FIGS. 9A and 9B show a schematic diagram of an LED with a thin active layer and confining layers of $Al_{0.5}In_{0.5}P$ and an LED with set-back layers.

FIG. 9a shows a schematic of an LED 10A having a thin active layer 12 and confining layers 14A, 14B of $Al_{0.5}In_{0.5}P$.

Figure 9B:
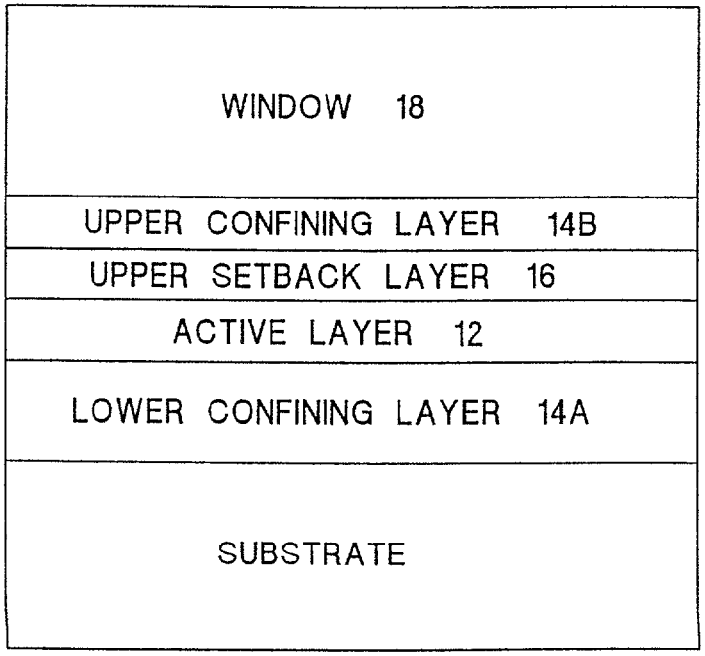

In this device, if there is too much p-type dopant in the upper confining layer 14B, it may diffuse into the n-type lower confining layer, causing the p-n junction to be misplaced. FIG. 9b shows an LED 10B that has a thin active layer 12, an AlGaInP upper set-back layer 16, and $Al_{0.5}In_{0.5}P$ confining layers 14A, 14B. The upper set-back layer 16 has not been doped. During growth of the window layer 18, the p-type dopant diffuses through the upper confining layer 14B, the upper set-back layer 16, and the active layer 12. The thickness of the upper set-back layer 16 or an optional lower set-back layers is chosen to maximize the likelihood that the p-n junction will be properly located after all high-temperature processing steps are completed. Although these figures do not explicitly show a lower-set-back-layer, one can be employed to accommodate a memory effect or diffusion of the n-type dopants.

In one embodiment, the high-temperature processing steps which the LED is subjected to cause the p-type dopant to diffuse between 5000 Å and 10,000 Å from the p-type upper confining layer. Consequently, a thin active layer LED would optimally have a total thickness of active layer and upper set-back layer of between 5000 Å and 10,000 Å, preferably 7500 Å. 590 nm-emitting LEDs with 2000 Å thick active layers and 5500 Å thick upper set-back layers have been found to provide superior performance. For a 630 nm LED, the optimal device might have a 500 Å thick active layer with a 7000 Å thick upper set-back layer. The external quantum efficiency of these devices has not been observed to vary more than 5%, in response to a 20% change in the doping level of the upper confining layer. This illustrates the effectiveness of the set-back layers at improving the yield of the manufacturing process.

When a set-back layer is used in the LED, the composition of this layer, because it adjoins the active region, will have an effect on the internal quantum efficiency. The external quantum efficiency of a preferred LED comprising a transparent substrate, a lower confining layer of $Al_{0.5}In_{0.5}P$ formed on the substrate, a 2000 Å thick active layer of $(Al_{0.3}Ga_{0.7})_{0.5}In_{0.5}P$ formed on the lower confining layer, a 5500 Å thick upper set-back layer of $(Al_{0.65}Ga_{0.35})_{0.5}In_{0.5}P$ formed on the active layer, an upper confining layer of $A_{0.5}In_{0.5}P$ formed on the upper set-back layer, and a window layer has an external quantum efficiency of 18.4% at 5 mA. An inferior LED comprises an upper set-back layer formed of $Al_{0.5}In_{0.5}P$ and is otherwise identical. The external quantum efficiency of this LED is 16.7% at 5 mA, which is 10% lower than that of the preferred LED. Additionally, measurements have been made on LEDs wherein the upper set-back layer is formed of $(Al_{0.8}Ga_{0.2})_{0.5}In_{0.5}P$ and $(Al_{0.5}Ga_{0.5})_{0.5}In_{0.5}P$. In none of these cases was the external quantum efficiency of the LED greater than that of the LED with an upper set-back layer formed of $(Al_{0.65}Ga_{0.35})_{0.5}In_{0.5}P$. Consequently, a preferred LED has an upper set-back layer formed of this particular composition of AlGaInP. The composition of the set-back layer improves the internal quantum efficiency of the device because it reduces the amount of leakage current out of the active layer. This reduction in leakage current is caused in part by the lower rate of non-radiative recombination in the set-back layer.

Another factor that affects the leakage current is the relative doping level of the active region and the upper set-back layer. The leakage current will be lower if the upper set-back layer is doped more heavily. In an LED with an upper set-back layer formed of $Al_{0.5}In_{0.5}P$, the doping level in the upper set-back layer is lower than in an upper set-back layer formed of $(Al_{0.65}Ga_{0.35})_{0.5}In_{0.5}P$. This is caused by diffusion and accumulation of the p-type dopant, during high-temperature processing steps, from the set-back layer into the active layer. The energy gap of $(Al_{0.65}Ga_{0.35})_{0.5}In_{0.5}P$ is less than that of $Al_{0.5}In_{0.5}P$, resulting in a higher doping level in the $(Al_{0.65}Ga_{0.35})_{0.5}In_{0.5}P$ set-back. Therefore, an $(Al_{0.65}Ga_{0.35})_{0.5}In_{0.5}P$ is preferable to an $Al_{0.5}In_{0.5}P$ set-back.

The superior carrier confinement of an LED with an upper set-back layer formed of $(Al_{0.65}Ga_{0.35})_{0.5}In_{0.5}P$ also improves the ability of the LED to maintain its internal quantum efficiency when its temperature is changed. In typical AlGaInP LEDs that emit 590 nm, the internal quantum efficiency decreases approximately 1–2% per degree Celsius increase in the temperature of the LED. The rate at which the efficiency decreases depends on the active layer alloy composition, and the rate decreases for longer-wavelength LEDs. The internal quantum efficiency of an AlGaInP LED comprising an upper set-back layer formed of $(Al_{0.65}Ga_{0.35})_{0.5}In_{0.5}P$ does not decrease as rapidly with increasing temperature, compared to an LED with set-backs formed of an alloy with a higher-Al mole fraction. An LED formed on a transparent substrate, with a lower confining layer formed of $Al_{0.5}In_{0.5}P$, a 2000 Å thick active layer formed of $(Al_{0.3}Ga_{0.7})_{0.5}In_{0.5}P$ on the lower confining layer, and an upper set-back layer formed of $(Al_{0.65}Ga_{0.35})_{0.5}In_{0.5}P$ on the active layer, exhibited a decrease in internal quantum efficiency of −1.3%/° C., while an identical LED, except that the upper set-back layer was formed of $(Al_{0.8}Ga_{0.2})_{0.5}In_{0.5}P$, exhibited a decrease of −1.4%/° C.

In U.S. Pat. No. 5,732,098, Nisitani et al. describe an AlGaInP LED with $(Al_xGa_{1-x})_{0.5}In_{0.5}P$ layers interposing the active layer and $Al_{0.5}In_{0.5}P$ confining layers wherein the energy-gap of the interposing layers is less than that of the confining layers or the aluminum mole fraction of the interposing layer is less. However, for the purpose of improving electron confinement in the active layer or other performance characteristics of the device, the composition of AlGaInP in the set-back layers may be chosen to be non-lattice-matched to the confining or active layers, and may have a wider energy gap than the confining layers or may have a higher Al mole fraction than the upper confining layer. A transparent substrate AlGaInP LED with a lower confining layer of $Al_{0.5}In_{0.5}P$, a 2000 Å thick active layer of $(Al_{0.3}Ga_{0.7})_{0.5}In_{0.5}P$ formed on the lower confining layer, a 500 Å thick first set-back layer of $Al_{0.615}In_{0.385}P$ formed on the active layer, a 5000 Å second set-back layer formed of $(Al_{0.65}Ga_{0.35})_{0.5}In_{0.5}P$ on the first set-back layer, and an upper confining layer formed of $Al_{0.5}In_{0.5}P$ on the second set-back layer, has an external quantum efficiency that is 10% greater than that of an LED wherein the first set-back layer is not present, the second set-back layer has a thickness of 5500 Å, and is otherwise identical. The first set-back layer formed of $Al_{0.615}In_{0.385}P$ causes the internal quantum efficiency to be higher because it has a wider band-gap than the upper confining layer and the second set-back layer, resulting in a smaller leakage current out of the active layer.

Figure 10:
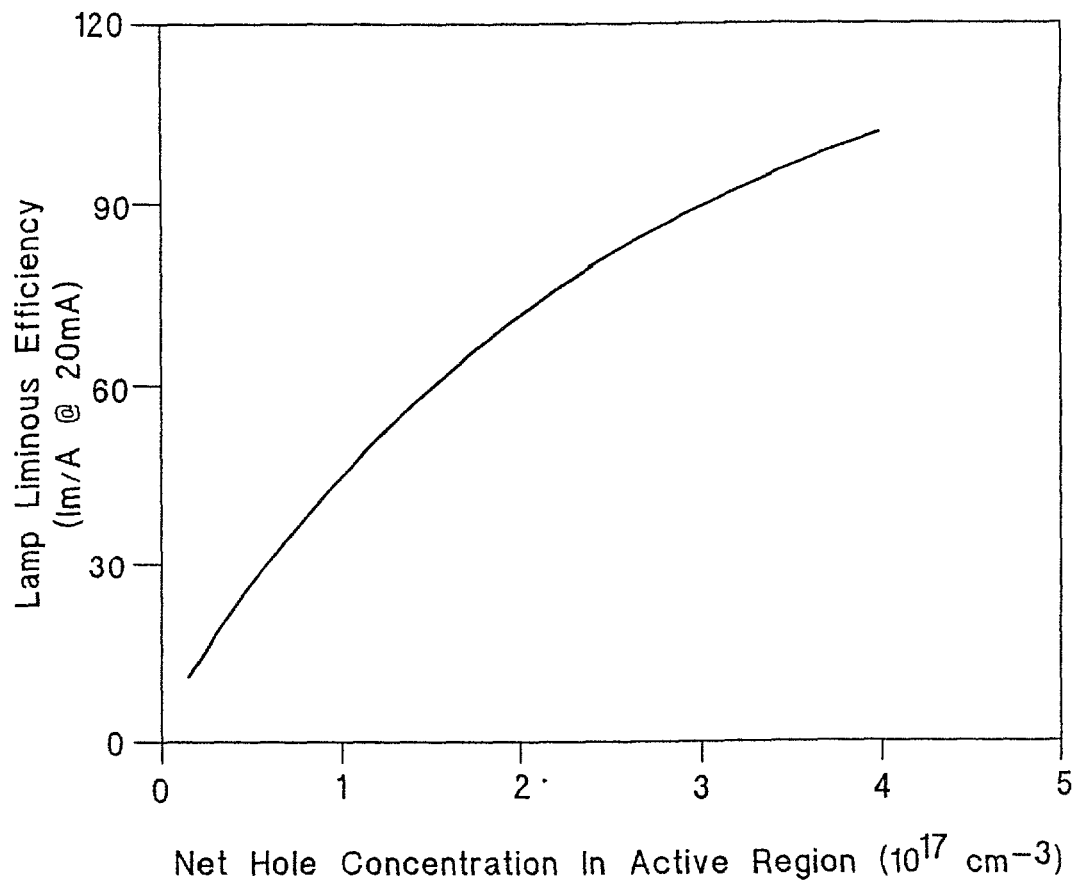
FIG. 10 shows the external quantum efficiency LEDs that have thin active layers emitting 590 nm light, set-back layers, and varying p-type doping levels in the active layer.

Another parameter that affects the internal quantum efficiency of the active layer is its doping level. The radiative recombination rate is proportional to the product of the electron and hole densities. The confining layers increase the efficiency of the LED by increasing the electron and hole densities in the active layer. The densities are also increased by incorporating more dopant atoms in the active layer. FIG. 10 shows the external quantum efficiency of 590 nm LEDs that have 2000 Å-thick active layers and $(Al_{0.65}Ga_{0.35})_{0.5}In_{0.5}P$ upper set-back layers, as the p-type doping level in the active layer is varied. This figure shows that the external quantum efficiency is improved when the doping level exceeds $10^{17}$ cm$^{-3}$, and tends to increase as doping level increases. Above a certain concentration (approximately $10^{19}$ cm$^{-3}$, depending on the dopant atom), the large concentration of dopant atoms causes the formation of dislocations or other defects that reduce the internal quantum efficiency of the LED. Therefore, a preferred LED has an active layer that is doped with a greater concentration than $10^{17}$ cm$^3$ and less than $10^{19}$ cm$^3$.

Internal quantum efficiency, particularly for short-wavelength LEDs, can be improved by replacing the active layer with multiple-quantum-well active regions, formed by using multiple (>5) thin layers of AlGaInP between multiple layers of a transparent AlGaInP alloy. To form a quantum well, the thickness of the AlGaInP active layer must be less than the wavelength of the electron wave function in AlGaInP (approximately 200 Å). Because it is difficult to maintain a uniform composition and thickness for multiple quantum well active layers in a high-volume manufacturing environment, the use of thicker wells is preferred. Thicker wells do not exhibit quantum confinement effects such as reduced emission wavelength. The use of multiple thicker wells increases the internal quantum efficiency of the active region, compared to a single active layer of greater thickness, because the carrier density in the wells is greater, resulting in a higher radiative recombination rate. At the same time, the absorbance of the active region (as calculated by Eq. 3) must satisfy the requirement of being less than 0.2.

Figure 11:
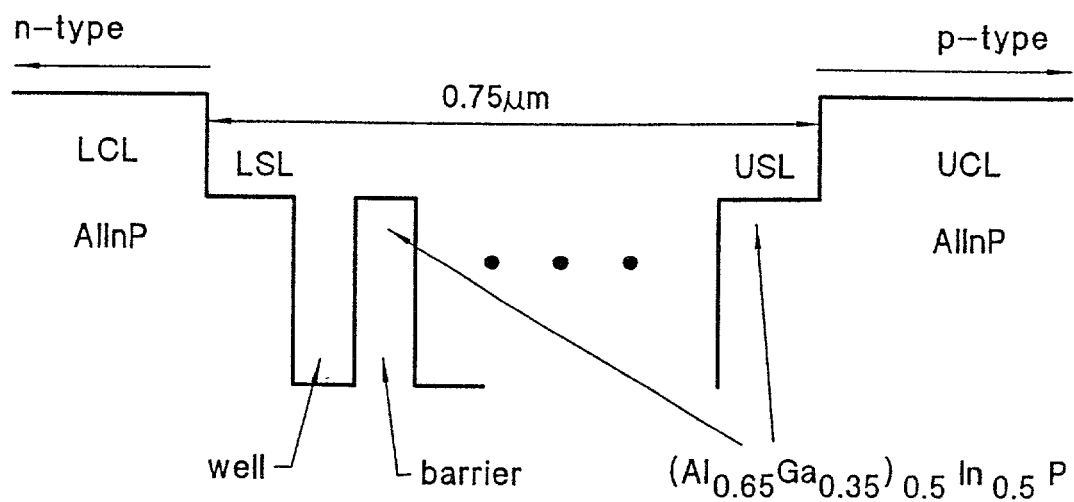
FIG. 11 shows a schematic representation of a particular embodiment of the multiple well active region device FIG. 12 show the external quantum efficiency of three LEDs as a function of current: A, curve a corresponds to a prior art LED; curve b corresponds to an LED having a 2000 Å thick active layer; and curve c corresponds to an LED having multiple well active layers consisting of four 500 Å light emitting layers.
Figure 12:
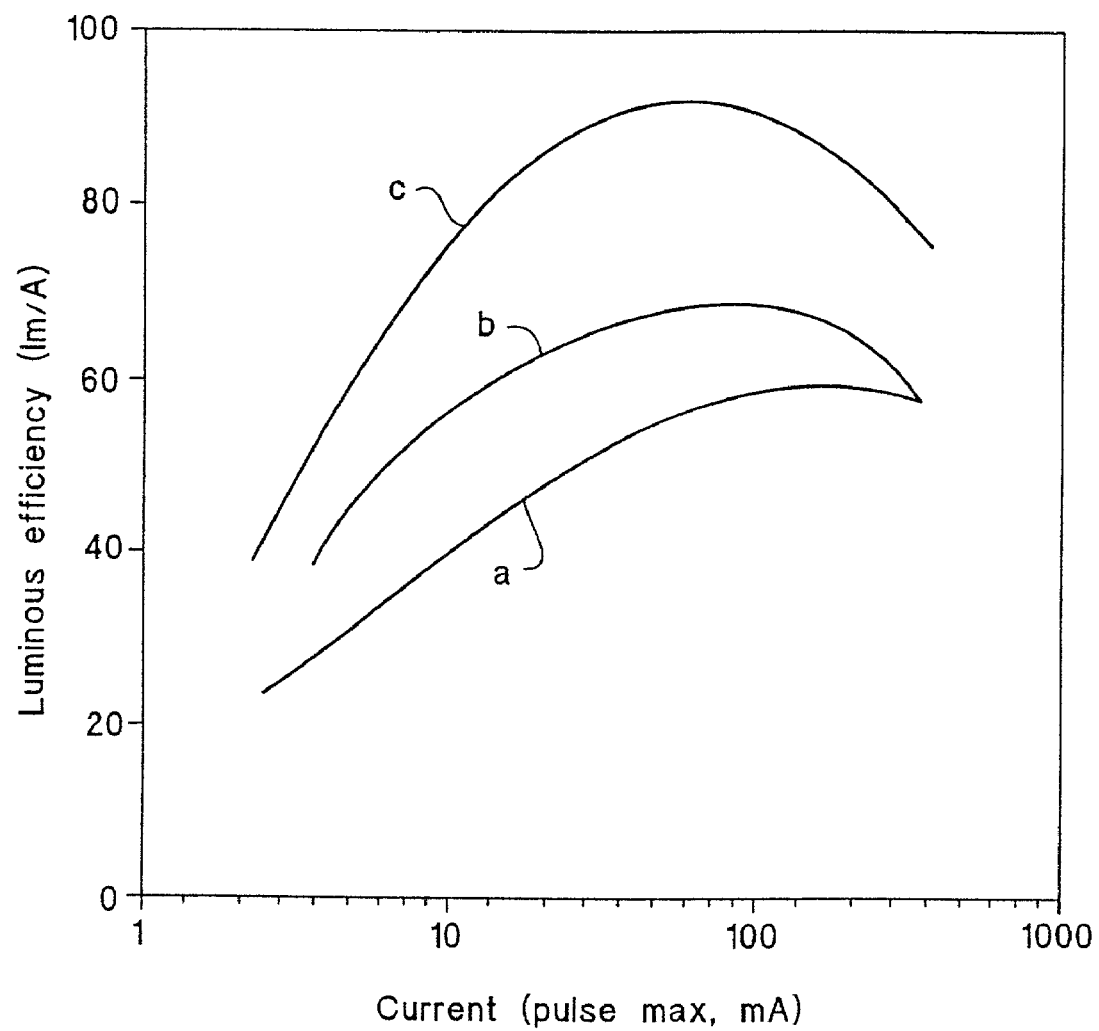

FIG. 11 shows a schematic representation of a multi-well active region in an LED. The figure shows an LED that has an active region, an upper set-back layer that is formed of $(Al_xGa_{1-x})_{0.5}In_{0.5}P$, and confining layers that are formed of $Al_{0.5}In_{0.5}P$. The barrier layers that are located between the active layers in the active region are formed of $(Al_xGa_{1-x})_{0.5}In_{0.5}P$, where x=0.55–1.0. The barrier layers may be formed of any semiconductor material that is transparent to the light emitted by the active layers, such as lattice matched or lattice mismatched AlGaInP or AlGaAs. The compositions and thicknesses of the layers (wells and barriers) are chosen to maximize the external quantum efficiency for the LED, and the optimal values are expected to be different for different alloy compositions of the wells (and hence emission wavelength). FIG. 12 shows the external quantum efficiency of three different LEDs as a function of current (L-I curves). Curve a is the L-I curve for a 590 nm LED with an active layer that is 7500 Å thick and confining layers formed of $Al_{0.5}In_{0.5}P$. Curve b is the L-curve for another 590 nm LED with an active layer that is 2000 Å thick and an 5500 Å-thick upper set-back layer formed of $(Al_{0.65}Ga_{0.35})_{0.5}In_{0.5}P$, and confining layers formed of $Al_{0.5}In_{0.5}P$. Curve c is the L-I curve for a 590 nm LED with an active region that contains four 500 Å-thick active layers, and interposing each active layer there is a 500 Å barrier layer of $(Al_{0.65}Ga_{0.35})_{0.5}In_{0.5}P$. The LED also contains a 4000 Å-thick $(Al_{0.65}Ga_{0.35})_{0.5}In_{0.5}P$ upper set-back layer, and $Al_{0.5}In_{0.5}P$ confining layers. When the LEDs are driven at 20 mA, the device corresponding to curve a has an external quantum efficiency of 4.5%, the device corresponding to curve b has an external quantum efficiency of 5.8%, and the device corresponding to curve c has an external quantum efficiency of 7.8%. The "wells" in the MW active layer are not thin enough to result in quantum-confinement effects (such as enlarged effective energy gap), so the emission wavelength of all three LEDs is similar. The same trend is observed for external quantum efficiency with active layer thickness for the different wavelengths, discussed previously and as shown in FIGS. 7 and 8. Since a MQW structure contains several light emitting layers, the active layer thickness is the sum of the thicknesses of all light emitting layers in the multiple well case. The thicknesses of the optically transparent barriers are not included in this total.

The internal quantum efficiency is improved partly due to the enhanced incorporation of the p-type dopant atoms in the wells. This increases the hole concentration in the wells and thus increases the radiative recombination rate, which in turn increases the internal quantum efficiency. A 3× increase in dopant concentration in the wells has been observed by secondary ion mass spectrometry of the device corresponding to curve c. When the LED undergoes high-temperature processing steps the dopant atoms diffuse out of the barriers and into the wells. The dopant atoms collect in the wells because they are more soluble in the narrow-gap AlGaInP alloy that form the wells than in the wider-gap AlGaInP alloy that forms the barriers. Another reason for the improved internal quantum efficiency is that majority charge carriers (electrons or holes) will tend to diffuse out of the wider-energy-gap barrier layers and into the narrower-gap wells. This further increase the radiative recombination rate.

Figure 13:
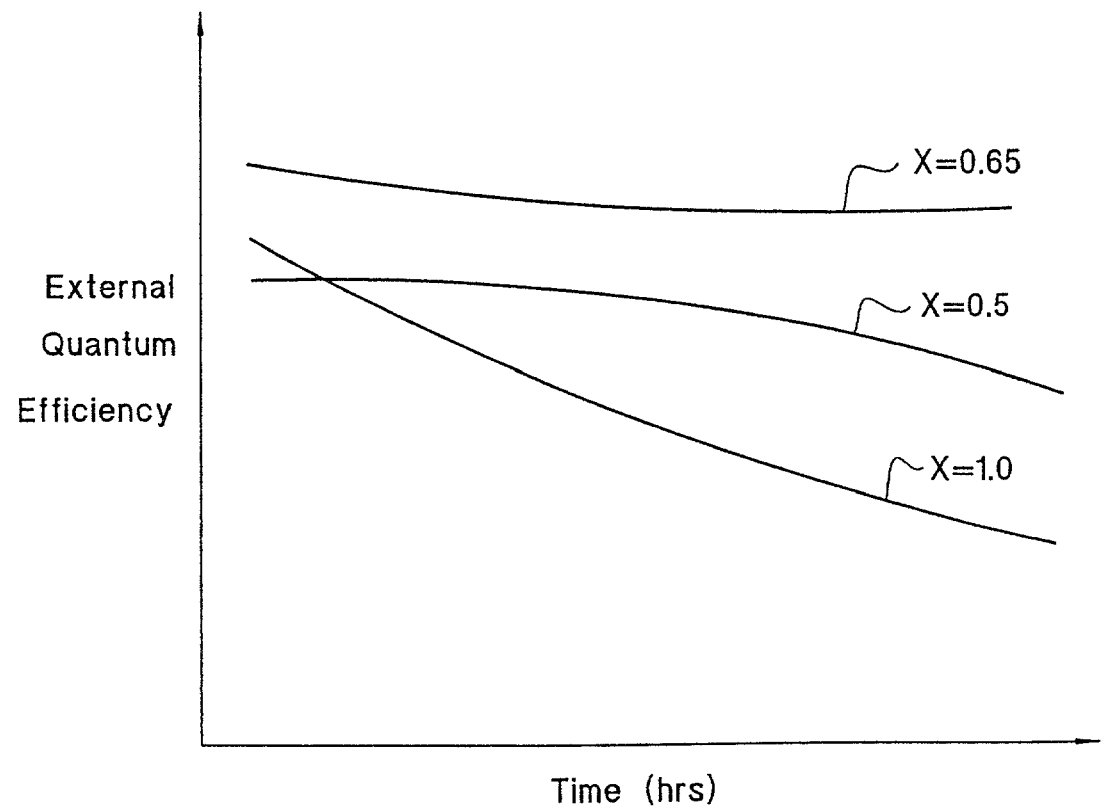
FIG. 13 shows the degradation in external quantum efficiency of three different 590 nm LEDs after prolonged operation.

The ability of an LED to maintain external quantum efficiency during operation is an important performance parameter. The composition of the upper set-back layer affects the reliability of the LED. FIG. 13 shows the degradation in external quantum efficiency during operation for 590 nm-emitting LEDs with 2000 Å thick active layers and 5500 Å thick upper set-back layers formed of various compositions of $(Al_xGa_{1-x})_{0.5}In_{0.5}P$. This figure shows that when the upper set-back layer is formed of lower-Al-content AlGaInP, the external quantum efficiency degrades less with time. The reliability of the LED with the $(Al_{0.5}Ga_{0.5})_{0.5}In_{0.5}P$ upper set-back layer is superior to that of the $(Al_{0.65}Ga_{0.35})_{0.5}In_{0.5}P$ upper set-back layer, but because of the aforementioned advantage in external quantum efficiency when the upper set-back layer is formed of $(Al_{0.65}Ga_{0.35})_{0.5}In_{0.5}P$, this composition is preferred. In other words, after prolonged operation, the remnant external quantum efficiency of an LED with an $(Al_{0.65}Ga_{0.35})_{0.5}In_{0.5}P$ set-back layer is greater than that of an LED with an $(Al_{0.5}Ga_{0.5})_{0.5}In_{0.5}P$ set-back layer.

Another technique for improving the reliability of AlGaInP LEDs is the use of oxygen doping in layers adjacent to the active region, as described by Stockman et al. in UK Patent Application 2,301,934A. Stockman et al. teaches that oxygen or other impurities improve the reliability of LEDs by inhibiting the formation or propagation of defects that reduce the lifetime of electrons and holes. The layers adjacent the active layer should be doped with oxygen because the leakage current is highest in these layers, and the formation of defects in these layers increases the leakage current. Layers located distal of the active layer have smaller leakage currents, therefore oxygen doping in these layers was not anticipated to improve the reliability of the LED.

Figure 14:
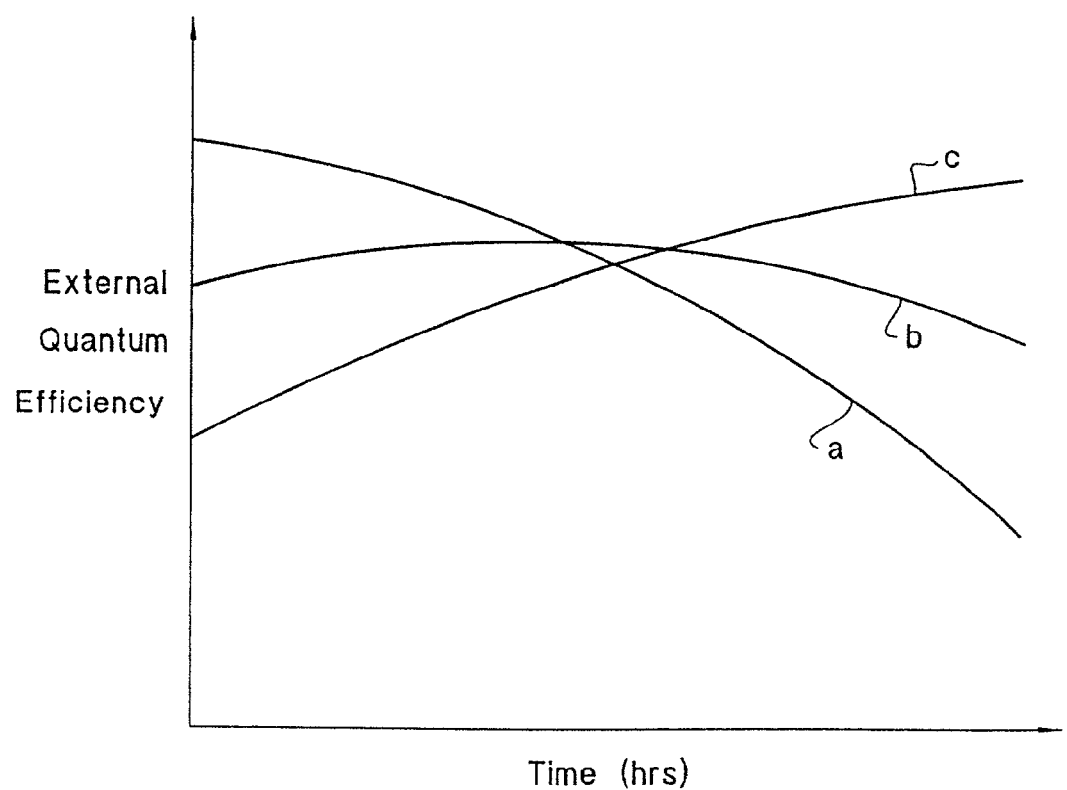
FIG. 14 shows the degradation in external quantum efficiency of LEDs comprising thin active layers and set-back layers after prolonged operation.

FIG. 14 shows the degradation in external quantum efficiency after prolonged operation for 590 nm LEDs that have 2000 Å thick active layers and 5500 Å thick $(Al_{0.65}Ga_{0.35})_{0.5}In_{0.5}P$ upper set-back layers. Curve a illustrates a device that does not contain any oxygen dopant. Curve b illustrates a device that contains oxygen only in the upper confining layer. Curve c illustrates a device that contains oxygen both in the upper confining layer and the interposing upper set-back layer. After prolonged operation, the remnant external quantum efficiency of the LED is highest when oxygen is present in the distal upper confining layer, whether or not the proximal upper set-back layer is doped with oxygen. It is apparent to those skilled in the art that if a set-back layer is formed of a plurality of layers of different semiconductor materials, then any of these layers distal of the active layer may be doped with oxygen and the reliability of the LED will be improved.

When comparing the external quantum efficiency of these devices, it was found that the efficiency (before stress) is highest when no oxygen is used and lowest when oxygen is present both in the upper confining layer and in the upper set-back layer. Furthermore, upon measuring the effect of different levels of oxygen doping in the upper confining layer, it was found that when the oxygen concentration (as measured by secondary-ion mass spectrometry) was less than $1\times10^{17}$ cm$^{-3}$, the reliability of the LED was poor. When the oxygen concentration exceeded $5\times10^{18}$ cm$^{-3}$, the internal quantum efficiency of the LED was poor. Therefore, the preferred range of oxygen dopant concentrations in the upper confining layer is $1\times10^{17}$ cm$^{-3}$ to $5\times10^{18}$ cm$^{-3}$.

Those skilled in the art will recognize that these principles and teachings may be extended to a number of LED device structures, including an absorbing substrate LED with a mirror layer interposing the active region and the substrate, as well as LEDs fabricated in other material systems (such as AlGaAs or InGaN).

We claim:

1. A light-emitting device comprising:
   a plurality of semiconductor layers comprising:
      a III-phosphide lower confining layer of a first conductivity type;
      a III-phosphide upper confining layer of a second conductivity type; and
      a III-phosphide active region disposed between the lower confining layer and the upper confining layer;
   wherein an absorbance of the active region is at least 20% of a total absorbance of all semiconductor layers in the device; and
   wherein the active region has a thickness less than 2000 Å.

2. The light emitting device of claim 1 wherein the active region has a thickness less than 1500 Å.

3. The light emitting device of claim 1 wherein the active region has a thickness less than 1000 Å.

4. The light emitting device of claim 1 wherein the active region has a thickness greater than 100 Å.

5. The light emitting device of claim 1 further comprising:
   a semiconductor substrate of the first conductivity type disposed proximate the lower confining layer;
   a transparent semiconductor window layer of the second conductivity type disposed proximate the upper, confining layer.

6. The light omitting device of claim 1 wherein the upper confining layer is doped with oxygen to a concentration between $10_{17}$ cm$_{-3}$ and $5\times10^{18}$ cm$^{-3}$.

7. The light emitting device of claim 1 further comprising an $(Al_xGa_{1-x})_yIn_{1-y}P$, $x \geq 0.55$, $0 \leq y \leq 1$ set-back layer disposed between the active region and one of the lower confining layer and the upper confining layer.

8. The light emitting device of claim 1 wherein the set-back layer is disposed between the active region and the upper confining layer, and wherein the set-back layer is doped with oxygen to a concentration between $10^{15}$ cm$^{-3}$ and $5\times10^{16}$ cm$^{-3}$.

9. The light emitting device of claim 1 wherein the active layer comprises:

a plurality of quantum well layers; and at least one barrier layer disposed between two quantum well layers.

10. The light emitting device of claim 7 wherein the set-back layer is disposed between the active region and the upper confining layer, and wherein a total thickness of the active region and the set-back layer is between 5000 and 10,000 Å.

11. The light emitting device of claim 1 wherein the active region is configured to emit light having a peak wavelength less than 600 nm, and wherein the active region has a thickness greater than 1000 Å and less than 2000 Å.

12. The light emitting device of claim 1 wherein the active region is configured to emit light having a peak wavelength between 600 and 620 nm, and wherein the active region has a thickness greater than 500 Å and less than 2000 Å.

13. The light emitting device of claim 1 wherein the active region is configured to emit light having a peak wavelength greater than 620 nm, and wherein the active region has a thickness greater than 200 Å and less than 1500 Å.

* * * * *

UNITED STATES PATENT AND TRADEMARK OFFICE
CERTIFICATE OF CORRECTION

PATENT NO.       : 7,087,941 B2
APPLICATION NO. : 10/011521
DATED            : August 8, 2006
INVENTOR(S)      : Nathan F. Gardner et al.

It is certified that error appears in the above-identified patent and that said Letters Patent is hereby corrected as shown below:

Face page, line 54: Please cancel "LLL-PHOSPHIDE" and substitute --III-PHOSPHIDE--.

Column 14, line 56: Cancel "$10_{17}$ cm$_{-3}$" and substitute --$10^{17}$ cm$^{-3}$--.

Column 14, line 61: Cancel "claim 1" and substitute --claim 7--.

Signed and Sealed this

Twenty-seventh Day of March, 2007

JON W. DUDAS
*Director of the United States Patent and Trademark Office*